(12) United States Patent
Matsumura et al.

(10) Patent No.: US 8,395,904 B2
(45) Date of Patent: Mar. 12, 2013

(54) MULTICHIP MODULE, PRINTED CIRCUIT BOARD UNIT, AND ELECTRONIC APPARATUS

(75) Inventors: Takayoshi Matsumura, Kawasaki (JP); Kenji Kobae, Kawasaki (JP); Shuichi Takeuchi, Kawasaki (JP); Tetsuya Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 154 days.

(21) Appl. No.: 12/821,938

(22) Filed: Jun. 23, 2010

(65) Prior Publication Data

US 2010/0328917 A1 Dec. 30, 2010

(30) Foreign Application Priority Data

Jun. 30, 2009 (JP) .................................. 2009-154641

(51) Int. Cl.
*H05K 7/00* (2006.01)
(52) U.S. Cl. ........ 361/783; 361/768; 174/256; 174/259; 174/260
(58) Field of Classification Search .................. None
See application file for complete search history.

(56) References Cited

U.S. PATENT DOCUMENTS

| | | | | |
|---|---|---|---|---|
| 5,949,654 A * | 9/1999 | Fukuoka | ........................ | 361/760 |
| 5,998,861 A * | 12/1999 | Hiruta | ........................ | 257/700 |
| 6,133,136 A * | 10/2000 | Edelstein et al. | ........................ | 438/618 |
| 6,202,298 B1 * | 3/2001 | Smith | ........................ | 29/840 |
| 6,396,155 B1 | 5/2002 | Nukiwa et al. | | |
| 6,486,411 B2 * | 11/2002 | Miura et al. | ........................ | 174/256 |
| 6,525,422 B1 | 2/2003 | Ono et al. | | |
| 6,737,741 B2 * | 5/2004 | Imasu et al. | ........................ | 257/723 |
| 6,930,032 B2 * | 8/2005 | Sarihan et al. | ........................ | 438/614 |
| 7,279,409 B2 | 10/2007 | Shiu et al. | | |
| 7,489,518 B2 * | 2/2009 | Matsuda | ........................ | 361/767 |
| 2006/0027933 A1 * | 2/2006 | Chen et al. | ........................ | 257/772 |
| 2007/0205520 A1 * | 9/2007 | Chou et al. | ........................ | 257/780 |
| 2009/0109641 A1 * | 4/2009 | Ishino et al. | ........................ | 361/760 |

FOREIGN PATENT DOCUMENTS

| | | |
|---|---|---|
| JP | 4-266037 | 9/1992 |
| JP | 7-169797 | 7/1995 |
| JP | 10-209210 | 8/1998 |
| JP | 11-214448 | 8/1999 |
| JP | 2001-85470 | 3/2001 |
| JP | 2003-249520 | 9/2003 |
| JP | 2006-186279 | 7/2006 |
| JP | 2007-129220 | 5/2007 |

OTHER PUBLICATIONS

Japanese Office Action mailed Nov. 6, 2012 for corresponding Japanese Application No. 2009-154641, with English-language translation.

* cited by examiner

*Primary Examiner* — Boris Chervinsky
(74) *Attorney, Agent, or Firm* — Fujitsu Patent Center

(57) ABSTRACT

A multichip module includes a package substrate, a first semiconductor device, a second semiconductor device and a conductive bump. The first semiconductor device is flip-chip bonded to the package substrate. The first semiconductor device includes a first chip pad on a surface thereof. The second semiconductor device is mounted on the first semiconductor device. The second semiconductor device includes a second chip pad facing the first chip pad. The conductive bump connects the first chip pad to the second chip pad. The conductive bump includes a first metallic body that has a first diffusion rate and a second metallic body that has a second diffusion rate lower than the first diffusion rate.

10 Claims, 15 Drawing Sheets

US 8,395,904 B2

MULTICHIP MODULE, PRINTED CIRCUIT BOARD UNIT, AND ELECTRONIC APPARATUS

CROSS-REFERENCE TO RELATED APPLICATION

This application is based upon and claims the benefit of priority of Japanese Patent Application No. 2009-154641, filed on Jun. 30, 2009, the entire contents of which are incorporated herein by reference.

FIELD

The embodiments discussed herein relate to a multichip module, a printed circuit board unit, and an electronic apparatus.

BACKGROUND

In a multichip module (MCM), at least two semiconductor chips are stacked together on a package substrate. An upper chip located at an upper side is, for example, flip-chip mounted on a lower chip located at a lower side. Typically, flip chip technology refers to a method for interconnecting semiconductor devices, such as IC chips, to external circuitry (e.g., the package substrate) with conductive bumps that have been deposited onto chip pads. Conductive bumps provided for the upper chip are placed on conductive pads provided on the lower chip. The conductive bumps provided for the upper chip are bonded in advance to conductive pads provided thereon. The conductive bumps are formed, for example, of gold (Au). The conductive pads are formed, for example, of aluminum (Al). Between the upper chip and the lower chip, an underfill material is filled. By the function of the underfill material, the upper chip is fixed to the lower chip (for example, see Japanese Laid-Open Patent Applications 2007-129220, 7-169797 and 2001-85470).

In the multichip module, gold of the conductive bump diffuses into aluminum of the conductive pad. Accordingly, an intermetallic compound is formed between the gold and the aluminum. When the intermetallic compound grows and comes in contact with, for example, adjacent conductive pads, short circuit occurs between the conductive pads. In addition, because of the difference in the diffusion rate between gold and aluminum, voids, which are called Kirkendall voids, are formed between the conductive pad and the conductive bump. As the voids are enlarged, an increase in resistance and an electrical disconnection unfavorably occur between the conductive pad and the conductive bump.

SUMMARY

According to an embodiment of the invention, a multichip module (MCM) includes a package substrate, a first semiconductor device, a second semiconductor device, and a conductive bump. The first semiconductor device is flip-chip bonded to the package substrate. The first semiconductor device includes a first chip pad on a surface thereof. The second semiconductor device is mounted on the first semiconductor device. The second semiconductor device includes a second chip pad facing the first chip pad. The conductive bump connects the first chip pad to the second chip pad. The conductive bump includes a first metallic body that has a first diffusion rate and a second metallic body that has a second diffusion rate lower than the first diffusion rate.

It is to be understood that both the foregoing general description and the following detailed description are exemplary and explanatory, and are not restrictive of the invention, as claimed.

BRIEF DESCRIPTION OF DRAWINGS

The above-described and other features of the invention will become apparent from the following description of the embodiments in conjunction with the accompanying drawings, wherein.

DESCRIPTION OF EMBODIMENTS

Hereinafter, with reference to the accompanying drawings, embodiments of the present invention will be described.

Figure 1:
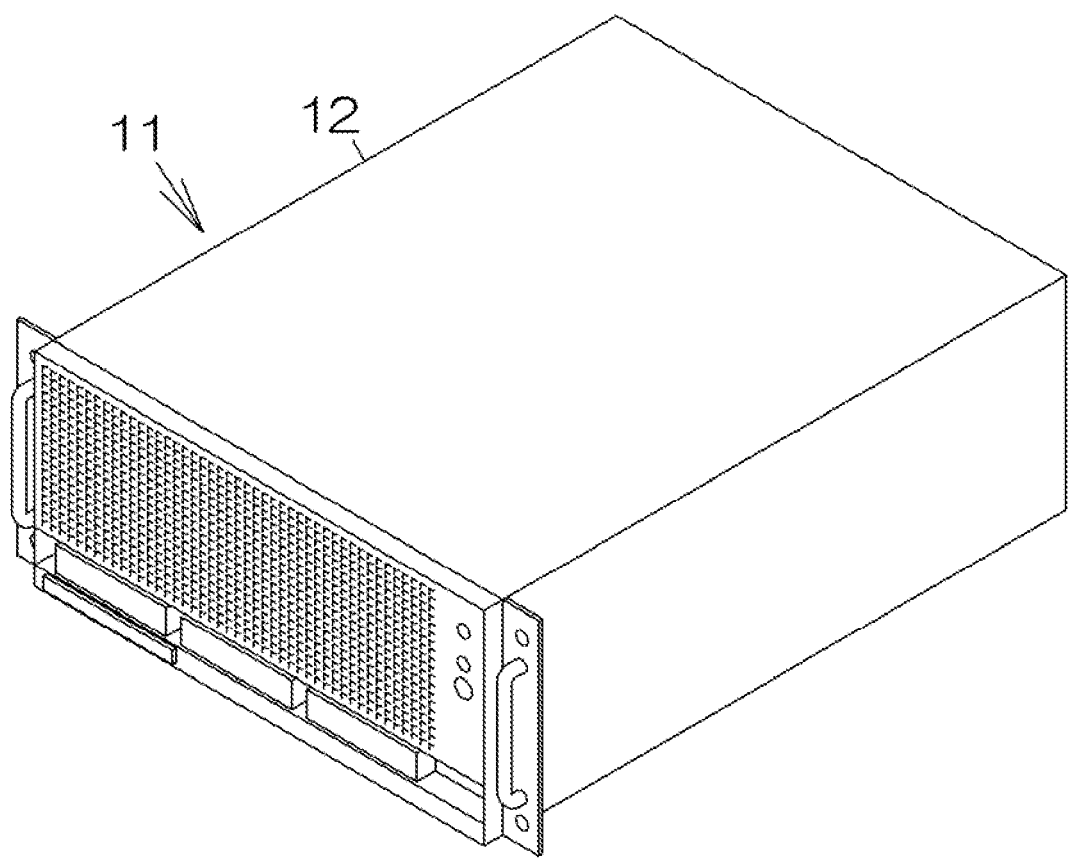
FIG. 1 is a schematic perspective view illustrating an example of an electronic apparatus according to the present invention.

FIG. 1 is a schematic perspective view illustrating an example of an electronic apparatus according to the present invention. The server computer apparatus 11 has an enclosure 12. In the enclosure 12, a receiving space is defined. In the receiving space, a motherboard is installed. On the motherboard, for example, a printed circuit board unit and/or a main memory is mounted. The printed circuit board unit includes, for example, a multichip module (MCM) that has a plurality of semiconductor devices. The printed circuit board unit executes various arithmetic processing based on, for example, software programs and/or data temporarily stored in the main memory. The server computer apparatus 11 as described above is mounted in a rack or the like.

Figure 2:
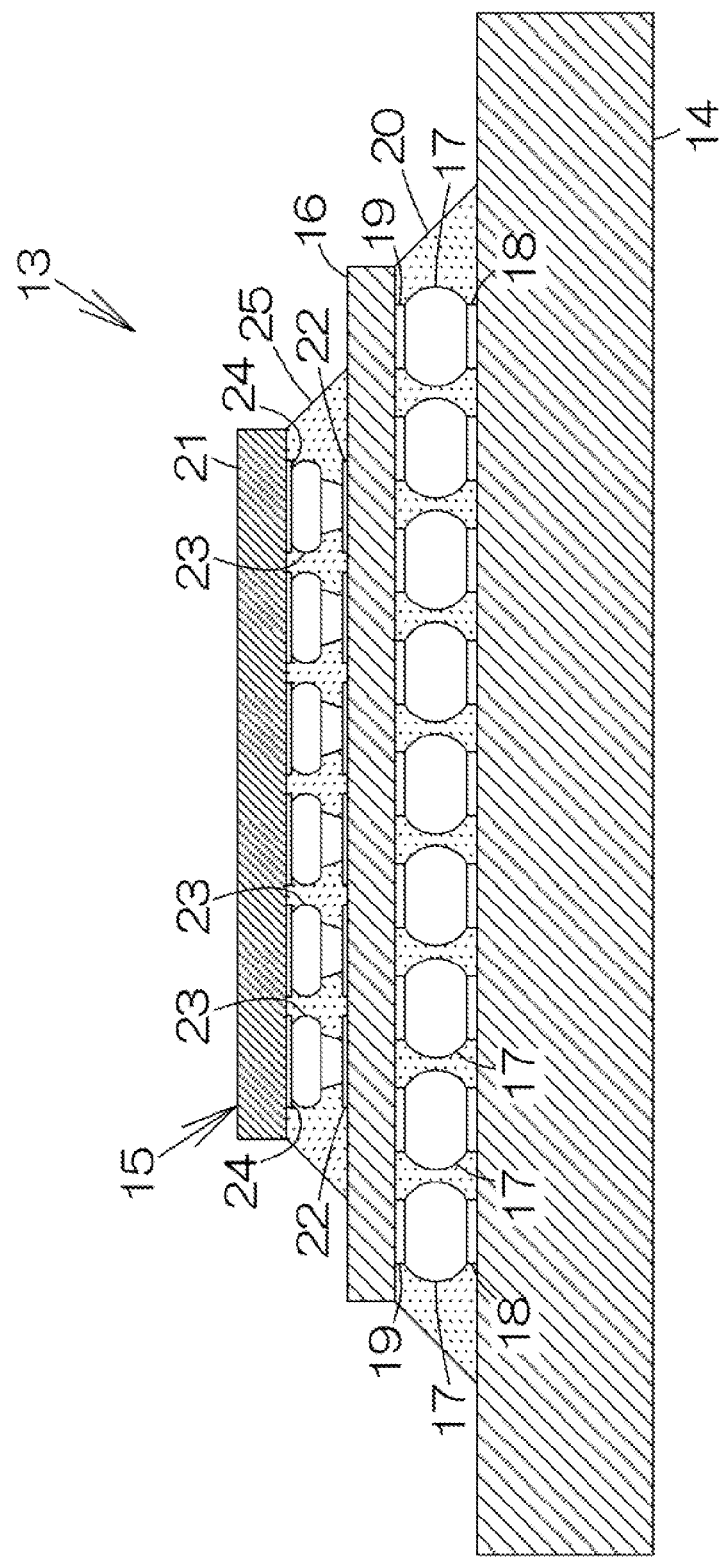
FIG. 2 is a cross-sectional view schematically illustrating a multichip module structure according to a first embodiment of the present invention.

FIG. 2 is a cross-sectional view schematically illustrating a multichip module structure according to a first embodiment of the present invention. The large scale integrated (LSI) chip package 13 includes a package substrate 14. The package substrate 14 is, for example, an organic substrate made of a plastic resin or the like. On the surface of the package substrate 14, a multichip module (MCM) 15 according to a first embodiment of the present invention is mounted. The multichip module 15 includes a lower side first semiconductor device, that is, an LSI chip 16. The LSI chip 16 extends parallel to the surface of the package substrate 14. The LSI chip 16 is formed, for example, of silicon.

The multichip module 15 includes a plurality of metal bumps 17 disposed on the surface of the package substrate 14 inside the outline of the LSI chip 16. The multichip module 15 is, for example, flip-chip bonded to the package substrate 14 by the metal bumps 17. The metal bumps 17 are each formed, for example, of a ball grid array (BGA) ball. The metal bumps 17 form a terminal bump group. The metal bumps 17 are formed of a solder material. As the solder material, for example, lead-free solder is used. The lead-free solder is formed, for example, of an alloy of tin (Sn), silver (Ag), and copper (Cu). The metal bump 17 connects a metallic chip pad 18 provided on the surface of the package substrate 14 to a metallic chip pad 19 provided on the lower surface of the LSI chip 16. The chip pads 18 and 19 are formed of a metal material such as copper.

The metal bumps 17 are sealed on the package substrate 14. That is, a space including the metal bumps 17 is filled with a solid underfill material 20 between the LSI chip 16 and the package substrate 14. The underfill material 20 is formed of a thermosetting resin material or the like. By the functions of the metal bumps 17 and the underfill material 20 described above, the multichip module 15 is fixed on the surface of the package substrate 14. In addition, the package substrate 14 on which the multichip module 15 is mounted is mounted on a printed circuit board (not illustrated in the figure) of the motherboard. When mounting is performed, for example, a ball grid array may be used.

The multichip module 15 includes an upper side second semiconductor device, that is, an LSI chip 21, mounted on the surface of the LSI chip 16. The LSI chip 21 extends parallel to the LSI chip 16. The LSI chip 21 is formed, for example, of silicon. A plurality of chip pads 22 is provided on the surface of the LSI chip 16. On the chip pads 22, conductive bumps, that is, metal bumps 23, are disposed. Chip pads 24 provided on the bottom surface, that is, the lower surface, of the LSI chip 21 are placed on the metal bumps 23. The metal bumps 23 are bonded to the chip pads 22 and 24. The chip pads 24 face the chip pads 22. In the first embodiment, the chip pads 24 correspond to the chip pads 22 on a one-to-one basis. The chip pads 22 and 24 are each formed, for example, of a metal material, such as aluminum.

In the LSI chips 16 and 21, a plurality of input/output signal lines is formed. The individual input/output signal lines are connected to the metal bumps 17 and 23. Accordingly, the input/output signal lines are drawn from the LSI chips 16 and 21. The metal bumps 23 are sealed on the LSI chip 16. That is, a space including the metal bumps 23 is filled with a solid underfill material 25 between the LSI chips 21 and 16. The underfill material 25 is formed, for example, from a thermosetting resin material. In addition, the LSI chip 21 forms a first support member. The LSI chip 16 forms a second support member. The metal bumps 23 and the chip pads 22 and 24 form bonding components.

Figure 3:
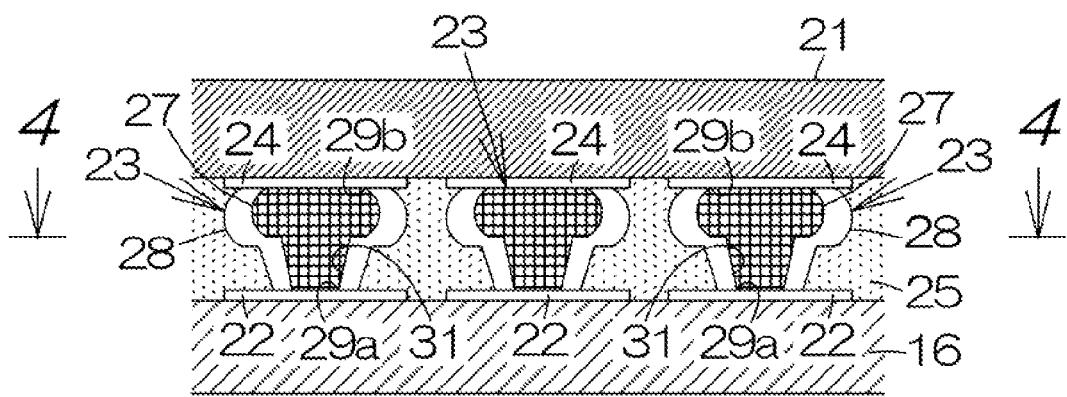
FIG. 3 is a cross-sectional view schematically illustrating a metal bump structure according to the first embodiment of the present invention.
Figure 4:
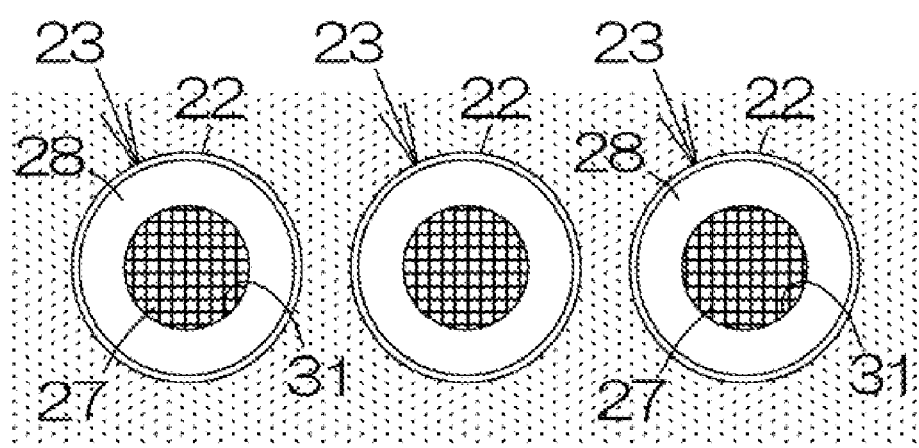
FIG. 4 illustrates a view taken along the line 4-4 of FIG. 3.

As illustrated in FIG. 3, the metal bump 23 has a first metallic body 27 and a second metallic body 28. The second metallic body 28 is formed to have a tubular shape. The second metallic body 28 is bonded to the chip pads 22 and 24. The second metallic body 28 defines a hollow space 31 that has a pair of open ends 29a and 29b which are closed by the chip pads 22 and 24, respectively. The hollow space 31 is filled with the first metallic body 27. The first metallic body 27 is bonded to the chip pads 22 and 24. As illustrated in FIG. 4 as well as in FIG. 3, the second metallic body 28 continuously surrounds the outer periphery of the first metallic body 27 between the chip pads 22 and 24. The first metallic body 27 is prevented from being exposed around the metal bump 23 between the chip pads 22 and 24. Accordingly, the metal bump 23 is formed as a double-layered bump in which the outside peripheral surface of the first metallic body 27 is covered with the second metallic body 28.

The first metallic body 27 is formed of a metal material which diffuses toward aluminum of the chip pads 22 and 24 at a first diffusion rate. In the first embodiment, the first metallic body 27 is formed of gold. The first metallic body 27 of gold ensures a sufficient bonding strength to the chip pads 22 and 24, each formed of aluminum. On the other hand, the second metallic body 28 is formed of a metal material which diffuses toward the metal material, that is, aluminum, of the chip pads 22 and 24 at a second diffusion rate which is lower than the first diffusion rate. In the metal material mentioned above, for example, an alloy containing gold and silver may be included. The alloy, for example, may be a gold-silver alloy. In the first embodiment, the second metallic body 28 is formed, for example, of an alloy containing 80% gold and 20% silver.

In the multichip module 15 described above, when the LSI chip 16 is operated, the metal bumps 23 and the chip pads 22 and 24 are exposed to a high temperature. Thus, gold of the metal bump 23 diffuses into aluminum of the chip pads 22 and 24. Since the second diffusion rate of the gold-silver alloy of the second metallic body 28 is set lower than the first diffusion rate of gold of the first metallic body 27, compared to the first metallic body 27, the growth of an intermetallic compound, that is, a gold-aluminum alloy, is suppressed between the second metallic body 28 and the chip pads 22 and 24. As a result, the intermetallic compound is prevented from extending to adjacent chip pads 22 and 24. Hence, the generation of short circuit is suppressed. Accordingly, the multichip module 15 described above can significantly contribute to reduce the pitch between the chip pads 22 and that between the chip pads 24.

In addition, the first metallic body 27 and the second metallic body 28 are both bonded to the chip pads 22 and 24. As described above, since the second metallic body 28 is formed of a gold-silver alloy, the generation of an intermetallic compound can be suppressed between the second metallic body 28 and the chip pads 22 and 24. Hence, even when voids, such as Kirkendall voids, are formed between the first metallic body 27 and the chip pads 22 and 24, the electrical conduction can be maintained by the second metallic body 28. As a result, for example, compared to the case in which the metal bump 23 is formed of gold itself, the electrical conduction between the metal bump 23 and the chip pads 22 and 24 can be maintained for a long period of time. Also, the solid underfill material 25 can reinforce the maintenance of the electrical conduction.

Figure 5:
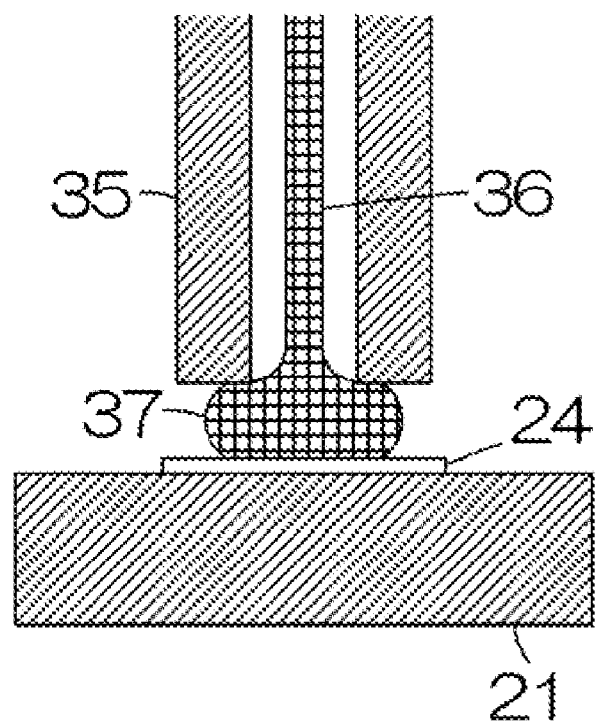
FIG. 5 illustrates a bonding process of a first metallic body on a chip pad according to the first embodiment.
Figure 6:
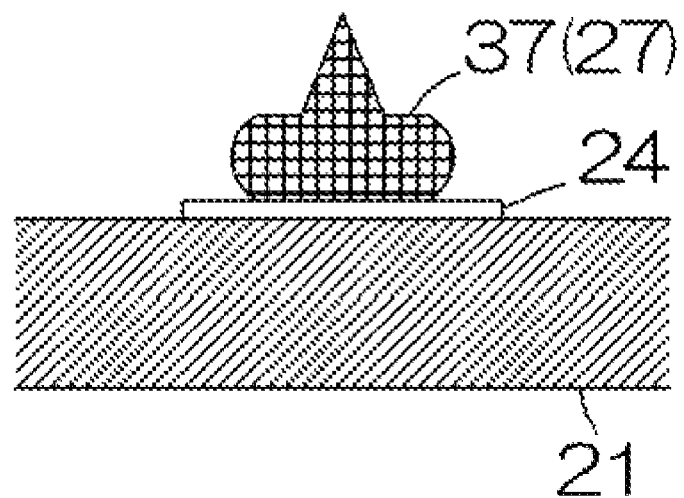
FIG. 6 illustrates a bonding process of a first metallic body on a chip pad according to the first embodiment.

Next, a method for manufacturing the multichip module 15 will be described. First, the LSI chip 21 is manufactured. The chip pads 24 are disposed on the lower surface of the LSI chip 21. For the formation of the chip pads 24, for example, sputtering is performed. Subsequently, as illustrated in FIG. 5, a capillary 35 is prepared. A gold wire 36 is placed in the capillary 35. A gold ball 37 is formed at an end of the capillary 35 using the gold wire 36. The gold ball 37 is pressed to the chip pad 24 and ultrasonic vibration is applied to the gold ball 37 through the capillary 35. As a result, the gold ball 37 is ultrasonically bonded to the chip pad 24. Subsequently, as illustrated in FIG. 6, the gold ball 37 is cut off from the gold wire 36 by lifting up the capillary 35. As described above, the first metallic body 27 is bonded to the chip pad 24.

Figure 7:
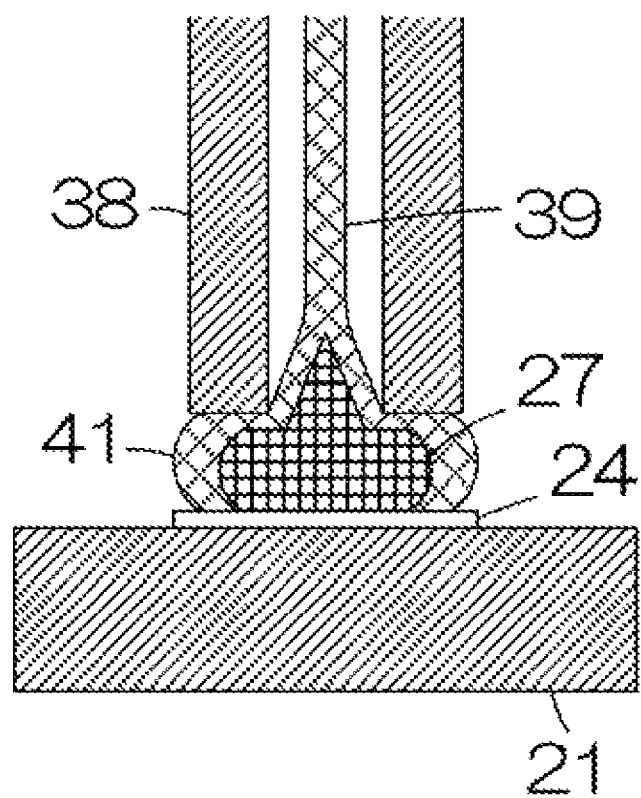
FIG. 7 illustrates a bonding process of a second metallic body on a chip pad according to the first embodiment.
Figure 8:
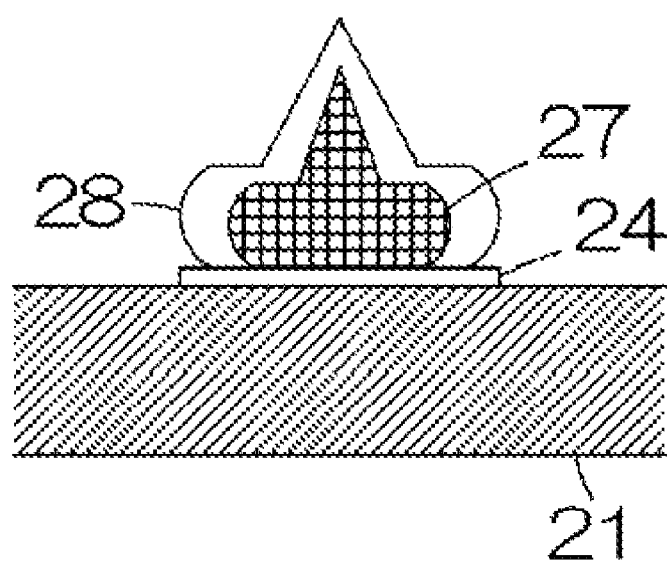
FIG. 8 illustrates a bonding process of a second metallic body on a chip pad according to the first embodiment.
Figure 9:
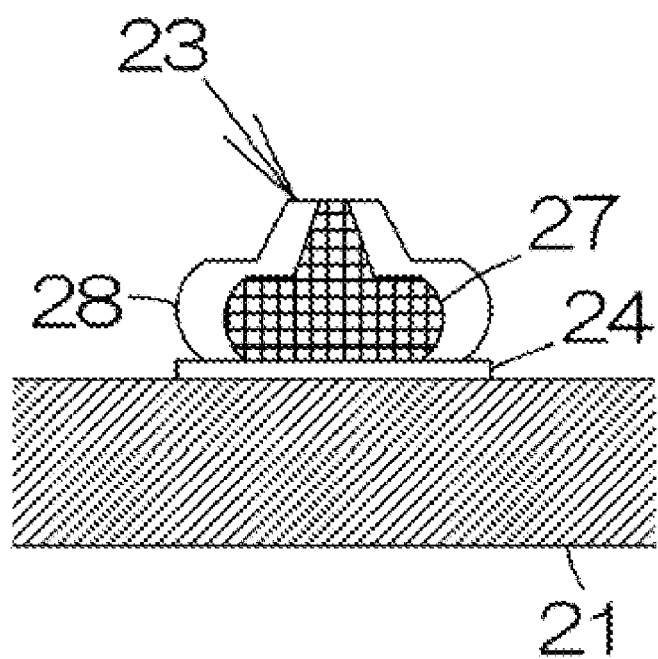
FIG. 9 illustrates a removing process of a peak of the second metallic body according to the first embodiment.

As illustrated in FIG. 7, a capillary 38 is prepared. In the capillary 38, a gold-silver alloy wire 39 is placed. A gold-silver alloy ball 41 formed at an end of the capillary 38 using the gold-silver alloy wire 39 covers the first metallic body 27 on the chip pad 24. Ultrasonic vibration is applied to the gold-silver alloy ball 41. As a result, the gold-silver alloy ball 41 is bonded to the chip pad 24 around the outer peripheral surface of the first metallic body 27. As illustrated in FIG. 8, the gold-silver alloy ball 41 is cut off from the end of the capillary 38 by lifting up the capillary 38. Accordingly, the second metallic body 28 is ultrasonically bonded to the chip pad 24. Subsequently, as illustrated in FIG. 9, when a peak of the second metallic body 28 is removed by machining, the first metallic body 27 inside the second metallic body 28 is exposed. As a result, the metal bump 23 is formed on the chip pad 24.

Figure 10:
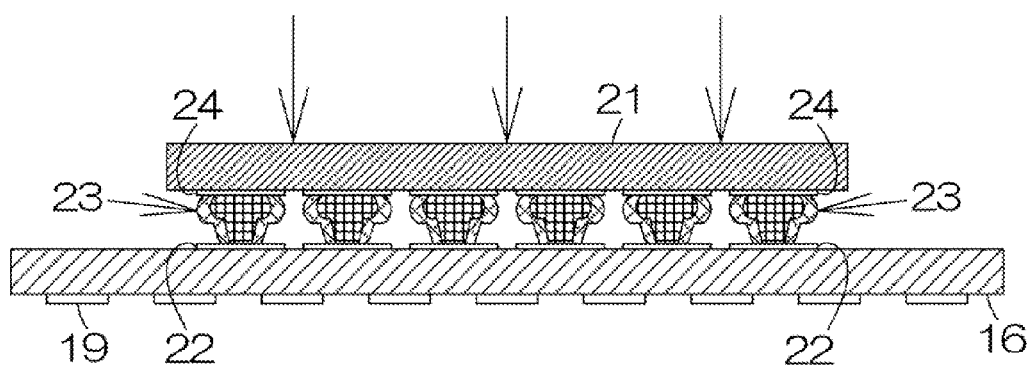
FIG. 10 illustrates a bonding process of one large scale integrated (LSI) chip on another LSI chip.

As illustrated in FIG. 10, the LSI chip 21 is disposed on the LSI chip 16. The chip pads 22 are formed in advance on the surface of the LSI chip 16. The metal bumps 23 are positioned on the chip pads 22. The LSI chip 21 is pressed toward the LSI chip 16 and ultrasonic vibration is applied to the LSI chip 21. As a result, the metal bumps 23 are ultrasonically bonded to the chip pads 22. Subsequently, between the LSI chip 21 and the LSI chip 16, for example, a liquid underfill material 25 is applied. The liquid underfill material 25 is cured by heating, and cured underfill material 25 fixes the LSI chip 21 to the LSI chip 16. Accordingly, the multichip module 15 is manufactured.

In the manufacturing method described above, before the pre-underfill material 25 is applied, the LSI chip 21 is mounted on the LSI chip 16 by the metal bumps 23. The first metallic body 27 of gold is bonded to the chip pads 22 and 24 at a bonding strength higher than that of the second metallic body 28. As a result, the LSI chip 21 is bonded to the LSI chip 16 at a sufficient bonding strength by the function of the first metallic body 27. Even when the multichip module 15 is transported for the application of the pre-underfill material 25, the bonding between the LSI chip 21 and the LSI chip 16 is maintained. On the other hand, the second metallic body 28 is bonded to the chip pads 22 and 24 at a bonding strength lower than that of the first metallic body 27; however, the bonding between the LSI chip 21 and the LSI chip 16 is reinforced by the underfill material 25.

Figure 11:
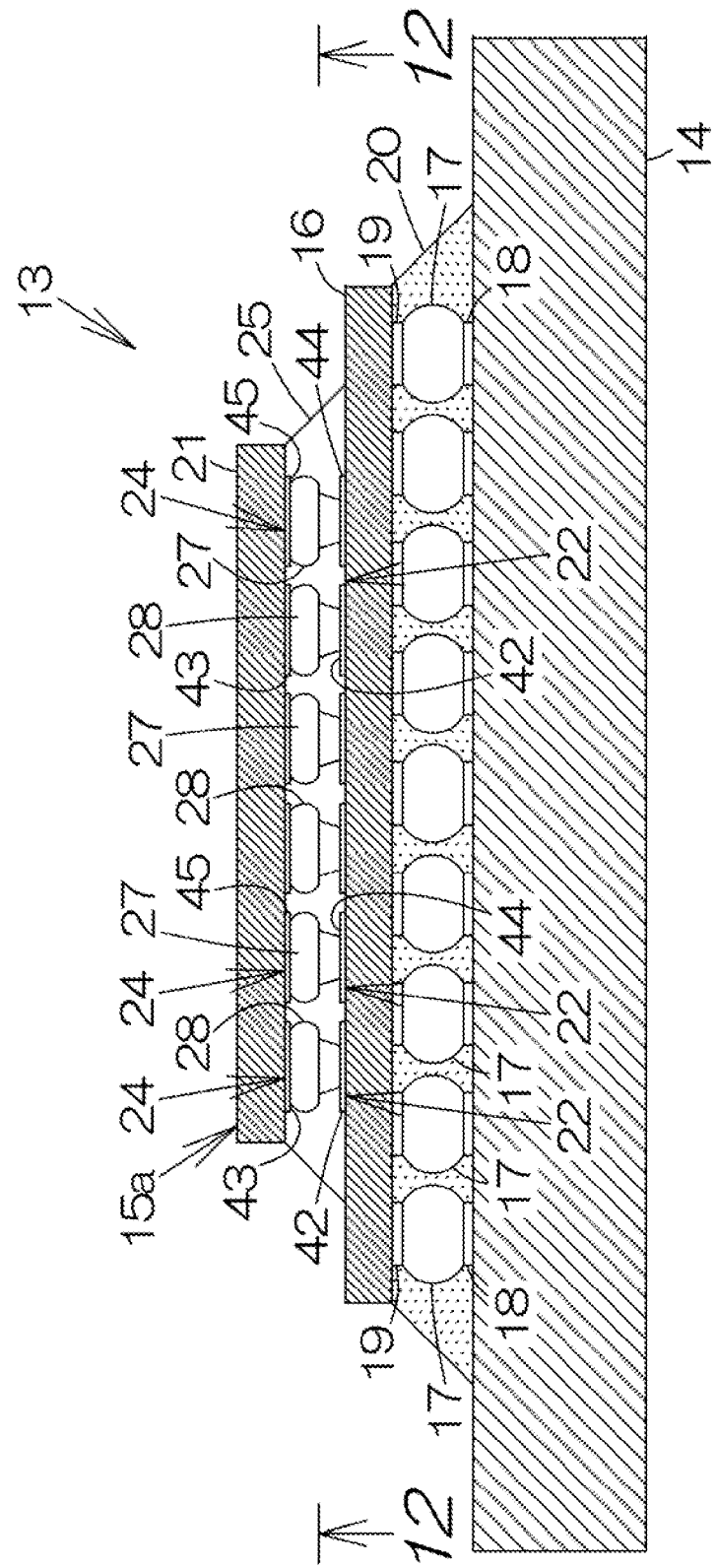
FIG. 11 is a cross-sectional view schematically illustrating a multichip module structure according to a second embodiment of the present invention.
Figure 12:
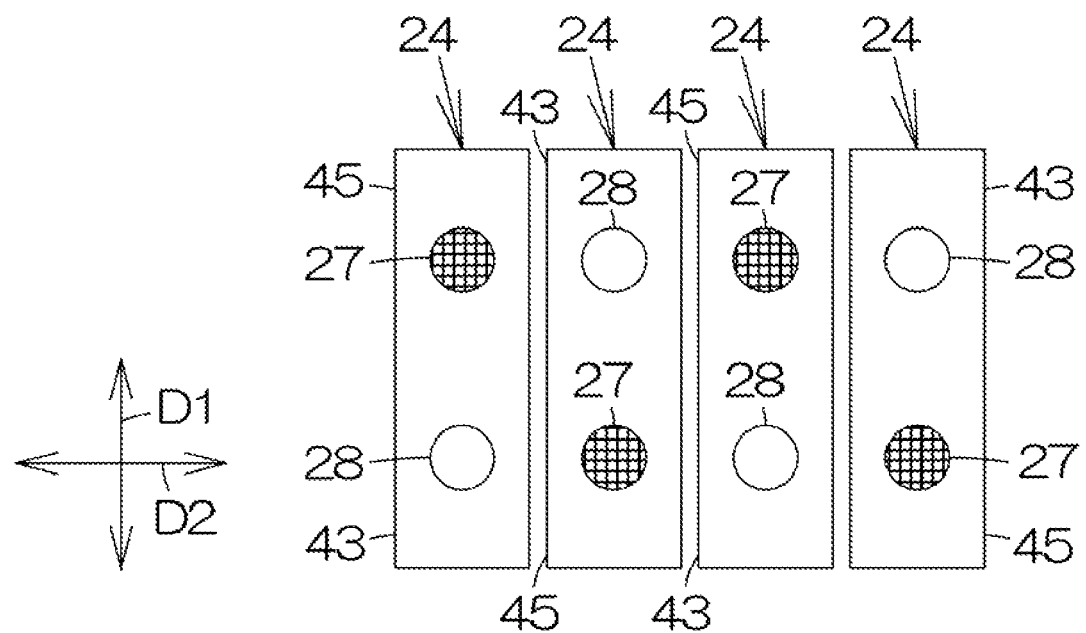
FIG. 12 illustrates a view taken along the line 12-12 of FIG. 11.

FIG. 11 is a cross-sectional view schematically illustrating a multichip module structure according to a second embodiment of the present invention. The multichip module 15a is mounted on the package substrate 14. In the multichip module 15a, as illustrated in FIGS. 11 and 12, the first metallic body 27 and the second metallic body 28 are separately disposed from each other. The second metallic body 28 is independently bonded to chip pads 42 and 43. The chip pad 43 faces the chip pad 42. The first metallic body 27 is independently bonded to chip pads 44 and 45. The chip pad 45 faces the chip pad 44. The second metal bodies 28 and the first metal bodies 27 are alternately disposed along the surface of the LSI chip 16. The chip pads 42 and 44 and the chip pads 43 and 45 are provided on the upper surface of the LSI chip 16 and the lower surface of the LSI chip 21, respectively.

On the lower surface of the LSI chip 21, the chip pads 43 and 45 are integrated with each other, as illustrated in FIG. 12. Accordingly, one pair of the chip pads 43 and 45 which are bonded to the second metallic body 28 and the first metallic body 27, respectively, forms the chip pad 24 described above.

On the upper surface of the LSI chip 16, the chip pads 42 and 44 are integrated with each other as in the case described above. Accordingly, one pair of the chip pads 42 and 44 which are bonded to the second metallic body 28 and the first metallic body 27, respectively, forms the chip pad 22 described above. The chip pad 24 defines, for example, a rectangular outline. The chip pad 22 defines the same outline as that of the chip pad 24.

The chip pads 24 each extend, for example, in a first direction D1 parallel to the lower surface of the LSI chip 21. The first metallic body 27 and the second metallic body 28 are alternately disposed on the chip pad 24 in the first direction D1. The chip pads 24 are disposed in a second direction D2 perpendicular to the first direction D1. In the second embodiment, the second metallic body 28 on an arbitrary chip pad 24 is adjacent to the first metallic body 27 on a chip pad 24 adjacent to the arbitrary chip pad 24. On the other hand, the first metallic body 27 on an arbitrary chip pad 24 is adjacent to the second metallic body 28 on a chip pad 24 adjacent to the arbitrary chip pad 24. As described above, the first metal bodies 27 and the second metal bodies 28 are alternately disposed in the second direction D2. In addition, configurations and structures equivalent to the configurations and structures of the multichip module 15 described in the first embodiment are designated by the same reference numerals.

In the multichip module 15a described in the second embodiment, one pair of the first metallic body 27 and the second metallic body 28 is bonded to the same chip pad 22 and the same chip pad 24. Hence, even when Kirkendall voids are formed between the first metallic body 27 and the chip pads 22 and 24 by an intermetallic compound, the electrical conduction can be maintained by the second metallic body 28. In addition, the second metallic body 28 is located adjacent to the first metallic body 27. Since the generation of an intermetallic compound is suppressed between the second metallic body 28 and the chip pads 22 and 24, compared to the case in which the second metallic body 28 is formed of gold, the intermetallic compound is prevented from extending to adjacent chip pads 22 and 24. Hence, the generation of short circuit can be suppressed. In addition, when the multichip module 15a is manufactured, the same operational advantages as those of the manufacturing method described above can also be realized.

Figure 13:
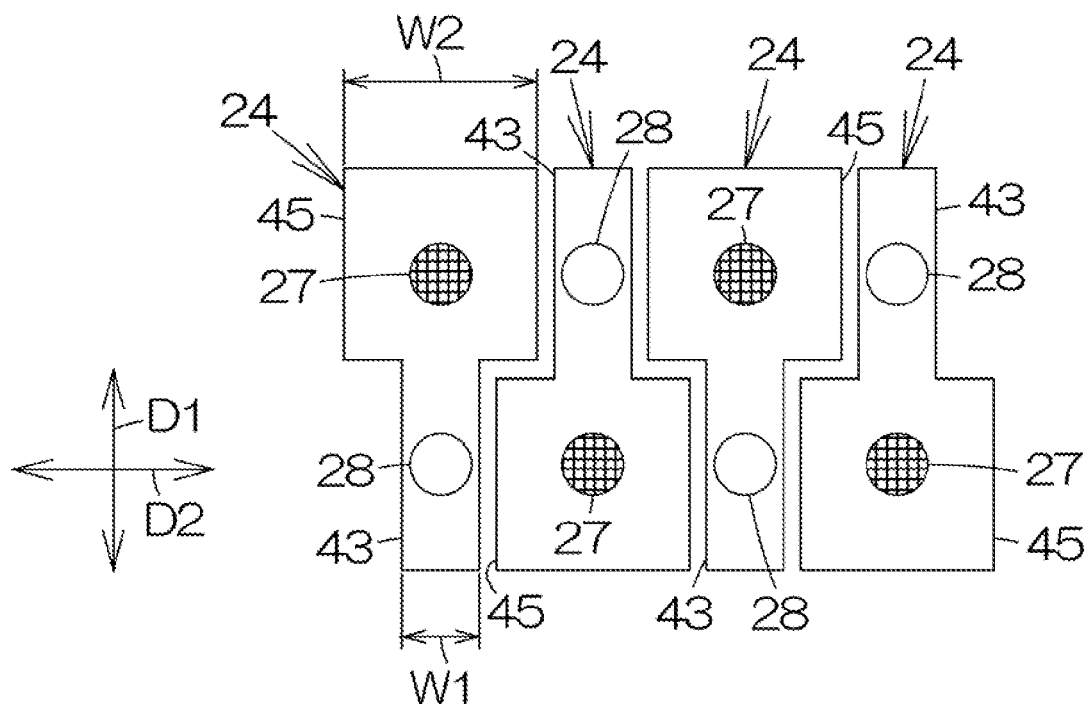
FIG. 13 illustrates a modified conductive bump arrangement and modified shape of conductive pads according to the second embodiment.

In the multichip module 15a as illustrated in FIG. 13, a width W1 of the chip pad 43 defined in the second direction D2 is set smaller than a width W2 of the chip pad 45 defined in the second direction D2 as described above. In addition, the width of the chip pad 43 and that of the chip pad 45 defined in the first direction D1 are set approximately equivalent to each other. As a result, the area of the chip pad 45 is set larger than the area of the chip pad 43. In the chip pad 45, the first metallic body 27 is preferably disposed at a central position of the chip pad 45. In addition, the chip pad 22 is formed in a manner similar to that for the chip pad 24. Furthermore, configurations and structures equivalent to the configurations and structures of the multichip module 15 described in the first embodiment are designated by the same reference numerals.

In the multichip module 15a described above, even when Kirkendall voids are formed between the first metallic body 27 and the chip pads 22 and 24 by an intermetallic compound, the electrical conduction can be maintained by the second metallic body 28. In addition, since a relatively large area is ensured in the chip pad 45, a relatively large distance can be ensured between the first metallic body 27 and the outline of the chip pad 45. Hence, the intermetallic compound is suppressed from extending to adjacent chip pads 22 and 24.

Furthermore, since the generation of the intermetallic compound is suppressed between the second metallic body 28 and the chip pads 22 and 24 compared to the case in which the second metallic body 28 is formed of gold, the intermetallic compound is suppressed from extending to adjacent chip pads 22 and 24. As a result, the generation of short circuit is suppressed.

Figure 14:
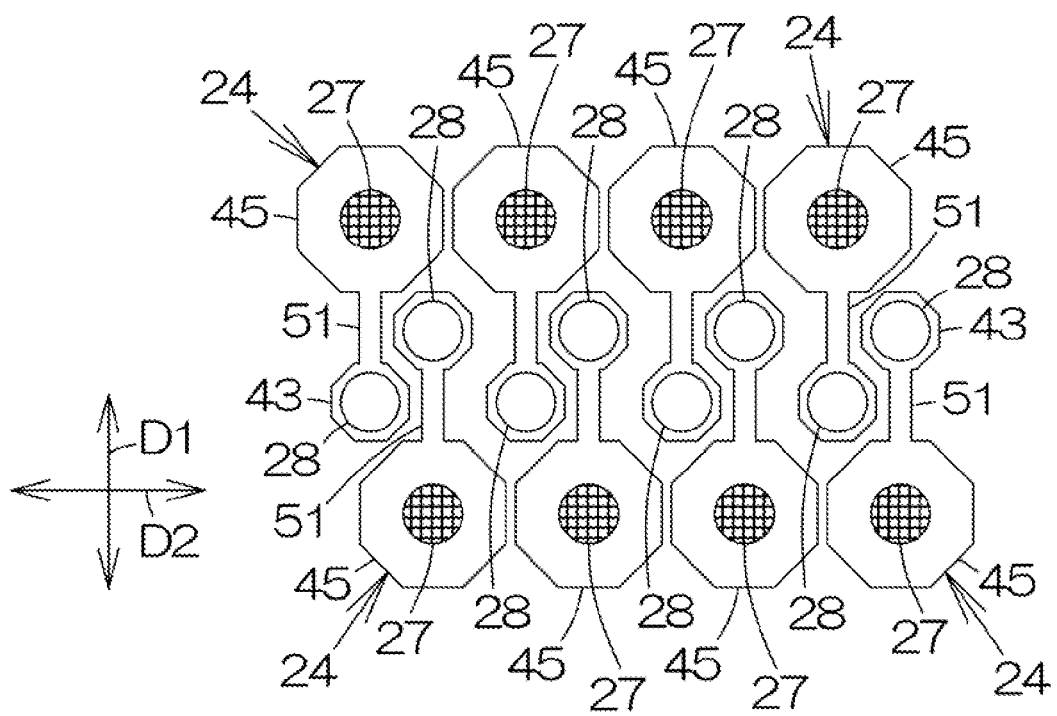
FIG. 14 illustrates another modified conductive bump arrangement and modified shape of conductive pads according to the second embodiment.

As illustrated in FIG. 14, the chip pad 24 has a wire pattern 51 connecting the chip pads 43 and 45. The wire pattern 51 extends, for example, in the first direction D1. The wire pattern 51 is formed of a metal material such as aluminum. The wire pattern 51 is integrated with the chip pads 43 and 45. The chip pads 43 and 45 each define, for example, a polygonal outline, that is, an octagonal outline. The chip pad 45 is formed to have a shape similar to that of the chip pad 43. The width in the first direction D1 and the width in the second direction D2 of the chip pad 45 are formed larger than those of the chip pad 43. The width of the wire pattern 51 defined in the second direction D2 may be set smaller than the width of the chip pad 43 defined in the second direction D2 as described above.

As illustrated in FIG. 14, a plurality pair of the chip pads 24 and 24 is disposed in the second direction D2. In each pair of the chip pads 24 and 24, the chip pads 24 and 24 are formed in a point-symmetric manner with respect to the intermediate point of the line segment between the second metal bodies 28. Accordingly, the chip pads 43 are disposed in the second direction D2. As in the chip pads 43, the chip pads 45 are also disposed in the second direction D2. The chip pads 43 are disposed between the chip pads 45. In addition, the chip pads 22 are also formed as in the case of the chip pads 24. In addition, configurations and structures equivalent to the configurations and structures of the multichip module 15 described in the first embodiment are designated by the same reference numerals.

Figure 15:
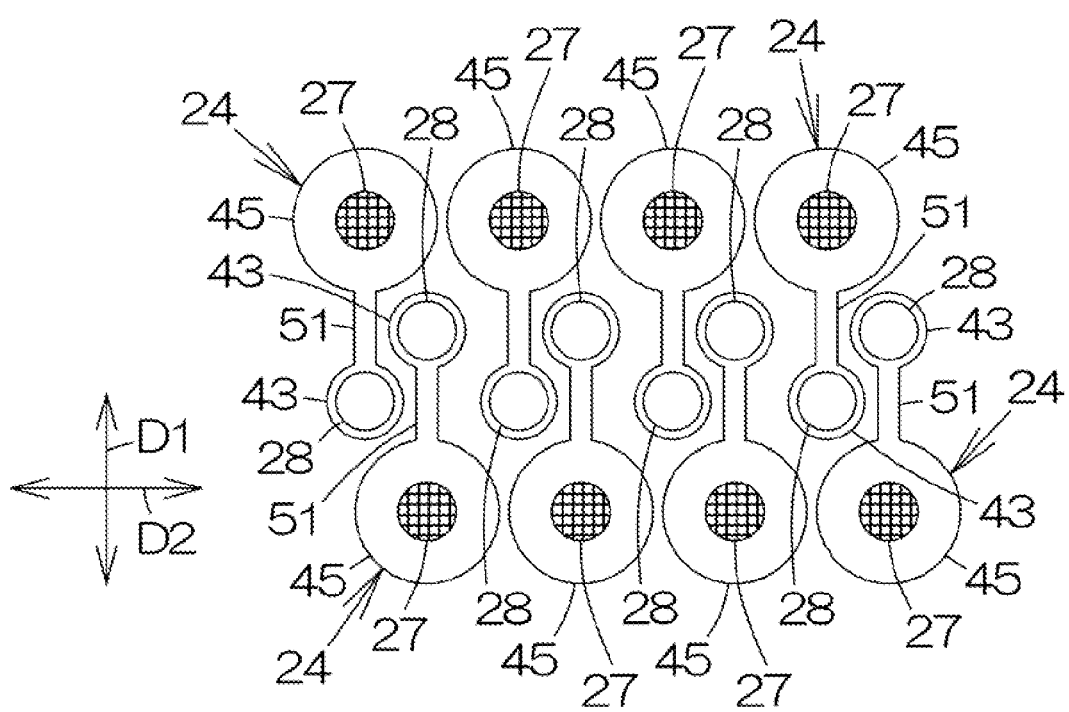
FIG. 15 illustrates yet another modified conductive bump arrangement and modified shape of conductive pads according to the second embodiment.

In the multichip module 15*a* described above, even when Kirkendall voids are formed between the first metallic body 27 and the chip pads 22 and 24 by an intermetallic compound, the electrical conduction can be maintained by the second metallic body 28. In addition, since a relatively large area is ensured in the chip pad 45, a relatively large distance can be ensured between the first metallic body 27 and the outline of the chip pad 45. Hence, the intermetallic compound is suppressed from extending to adjacent chip pads 22 and 24. Furthermore, since the generation of the intermetallic compound is suppressed between the second metallic body 28 and the chip pads 22 and 24, compared to the case in which the second metallic body 28 is formed of gold, the intermetallic compound is suppressed from extending to adjacent chip pads 22 and 24. As a result, the generation of short circuit is suppressed. In addition, as illustrated in FIG. 15, the chip pads 43 and 45 each may also define a circular outline.

All examples and conditional language provided herein are intended for the pedagogical objects to aid the reader in understanding the invention and the concepts contributed by the inventors to further the art, and are to be construed as being without limitation to such specifically recited examples and conditions, nor does the organization of such examples in the specification relate to a illustrating of the superiority and inferiority of the invention. Although the embodiments of the invention have been described in detail, it will be understood by those of ordinary skill in the relevant art that various changes, substitutions, and alterations could be made hereto without departing from the spirit and scope of the invention as set forth in the claims.

What is claimed is:

1. A multichip module comprising:
a package substrate;
a first semiconductor device flip-chip bonded to the package substrate, the first semiconductor device including a first chip pad on a surface thereof;
a second semiconductor device mounted on the first semiconductor device, the second semiconductor device including a second chip pad facing the first chip pad; and
a conductive bump connecting the first chip pad to the second chip pad,
wherein the conductive bump includes a first metallic body having a first diffusion rate and a second metallic body having a second diffusion rate lower than the first diffusion rate.

2. The multichip module according to claim 1, wherein the conductive bump has a double-layered structure where the second metallic body covers an outer peripheral surface of the first metallic body.

3. The multichip module according to claim 1, wherein the first metallic body and the second metallic body are separately disposed on the first chip pad.

4. The multichip module according to claim 1, wherein the first metallic body and the second metallic body are separately disposed on the second chip pad.

5. The multichip module according to claim 3, wherein the first metallic body is disposed on a region having a greater width than a region where the second metallic body is disposed.

6. The multichip module according to claim 4, wherein the first metallic body is disposed on a region having a greater width than a region where the second metallic body is disposed.

7. The multichip module according to claim 1, wherein the first chip pads and the second chip pads are formed of aluminum, and
the first metallic body is formed of gold while the second metallic body is formed of gold alloy.

8. The multichip module according to claim 1, further comprising a thermosetting resin is underfilled between the first semiconductor device and the second semiconductor device.

9. A printed circuit board unit comprising:
a printed circuit board;
a package substrate mounted on the printed circuit board;
a first semiconductor device flip-chip bonded to the package substrate, the first semiconductor device including a first chip pad on a surface thereof;
a second semiconductor device mounted on the first semiconductor device, the second semiconductor device including a second chip pad facing the first chip pad; and
a conductive bump connecting the first chip pad to the second chip pad,
wherein the conductive bump includes a first metallic body having a first diffusion rate and a second metallic body having a second diffusion rate lower than the first diffusion rate.

10. An electronic apparatus comprising:
an enclosure;
a printed circuit board installed in the enclosure;
a package substrate mounted on the printed circuit board;
a first semiconductor device flip-chip bonded to the package substrate, the first semiconductor device including a first chip pad on a surface thereof;

a second semiconductor device mounted on the first semiconductor device, the second semiconductor device including a second chip pad facing the first chip pad; and a conductive bump connecting the first chip pad to the second chip pad, wherein the conductive bump includes a first metallic body having a first diffusion rate and a second metallic body having a second diffusion rate lower than the first diffusion rate.

* * * * *